(12) United States Patent
Chou

(10) Patent No.: US 12,543,584 B2
(45) Date of Patent: Feb. 3, 2026

(54) SEMICONDUCTOR DEVICE PACKAGE INCLUDING MULTIPLE SUBSTRATES WITH DIFFERENT FUNCTIONS

(71) Applicant: Advanced Semiconductor Engineering, Inc., Kaohsiung (TW)

(72) Inventor: Yi Chun Chou, Kaohsiung (TW)

(73) Assignee: ADVANCED SEMICONDUCTOR ENGINEERING, INC., Kaohsiung (TW)

( * ) Notice: Subject to any disclaimer, the term of this patent is extended or adjusted under 35 U.S.C. 154(b) by 0 days.

(21) Appl. No.: 18/631,020

(22) Filed: Apr. 9, 2024

(65) Prior Publication Data
US 2024/0258229 A1 Aug. 1, 2024

Related U.S. Application Data

(63) Continuation of application No. 18/092,922, filed on Jan. 3, 2023, now Pat. No. 11,955,419, which is a
(Continued)

(51) Int. Cl.
*H01L 23/498* (2006.01)
*H01L 21/48* (2006.01)
(Continued)

(52) U.S. Cl.
CPC .... *H01L 23/49838* (2013.01); *H01L 21/4846* (2013.01); *H01L 23/49833* (2013.01);
(Continued)

(58) Field of Classification Search
CPC .......... H01Q 1/2283; H01L 2223/6677; H01L 23/66; H01L 2924/3025; H01L 23/552;
(Continued)

(56) References Cited

U.S. PATENT DOCUMENTS

| 6,593,223 B1 | 7/2003 | Huang et al. |
| 2006/0081982 A1 | 4/2006 | Huang et al. |

(Continued)

FOREIGN PATENT DOCUMENTS

CN 104347558 A 2/2015

OTHER PUBLICATIONS

Non-Final Office Action for U.S. Appl. No. 17/151,066, issued May 12, 2022, 14 pages.
(Continued)

*Primary Examiner* — Didarul A Mazumder
(74) *Attorney, Agent, or Firm* — FOLEY & LARDNER LLP

(57) ABSTRACT

The present disclosure provides a semiconductor device package including a first substrate and an adhesive layer. The first substrate has a first surface and a conductive pad adjacent to the first surface. The conductive pad has a first surface exposed from the first substrate. The adhesive layer is disposed on the first surface of the first substrate. The adhesive layer has a first surface facing the first substrate. The first surface of the adhesive layer is spaced apart from the first surface of the conductive pad in a first direction substantially perpendicular to the first surface of the first substrate. The conductive pad and the adhesive layer are partially overlapping in the first direction.

19 Claims, 16 Drawing Sheets

Related U.S. Application Data continuation of application No. 17/151,066, filed on Jan. 15, 2021, now Pat. No. 11,545,426.

(51) Int. Cl.
*H01L 23/552* (2006.01)
*H01L 23/66* (2006.01)
*H01Q 1/22* (2006.01)

(52) U.S. Cl.
CPC ............ H01L 23/552 (2013.01); H01L 23/66 (2013.01); H01Q 1/2283 (2013.01); *H01L 2223/6677* (2013.01)

(58) Field of Classification Search
CPC . H01L 2224/16227; H01L 2224/48227; H01L 24/16; H01L 24/48; H01L 21/4857; H01L 23/5383; H01L 23/49838
USPC .......................................... 257/428; 438/57
See application file for complete search history.

(56) References Cited

U.S. PATENT DOCUMENTS

| | | | | |
|---|---|---|---|---|
| 2007/0148817 A1* | 6/2007 | Williams | ............. | H05K 3/3436 257/E23.068 |
| 2008/0054489 A1* | 3/2008 | Farrar | .................... | H01L 24/73 257/E21.705 |
| 2009/0001602 A1* | 1/2009 | Chung | .................... | H01L 24/08 438/109 |
| 2012/0074571 A1* | 3/2012 | Lavoie | ............... | H01L 23/53238 257/E23.161 |
| 2012/0273938 A1* | 11/2012 | Choi | ...................... | H01L 24/13 257/E21.507 |
| 2013/0037802 A1* | 2/2013 | England | ............. | H01L 25/0657 257/E23.179 |
| 2016/0240503 A1* | 8/2016 | Shu | ........................ | H01L 21/563 |
| 2016/0268182 A1 | 9/2016 | Lee et al. | | |
| 2019/0067142 A1* | 2/2019 | Fang | ....................... | H01L 24/17 |
| 2019/0164933 A1 | 5/2019 | Lee | | |
| 2020/0098709 A1* | 3/2020 | Lin | ..................... | H01L 21/4857 |
| 2020/0243441 A1* | 7/2020 | Hsiao | .................. | H10D 62/393 |
| 2021/0175627 A1 | 6/2021 | Yi et al. | | |

OTHER PUBLICATIONS

Non-Final Office Action for U.S. Appl. No. 18/092,922, issued Aug. 17, 2023, 10 pages.

Notice of Allowance for U.S. Appl. No. 17/151,066, issued Sep. 6, 2022, 9 pages.

Notice of Allowance for U.S. Appl. No. 18/092,922, issued Dec. 8, 2023, 9 pages.

\* cited by examiner

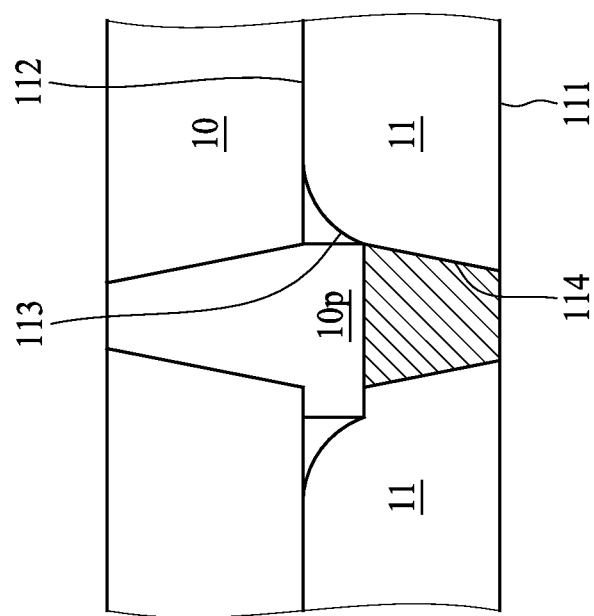
FIG. 1B"

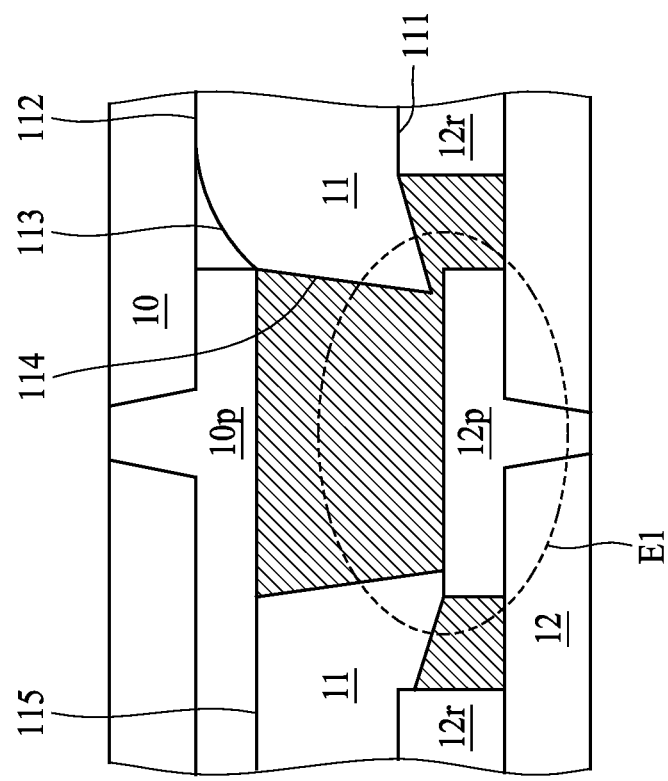
FIG. 1D"

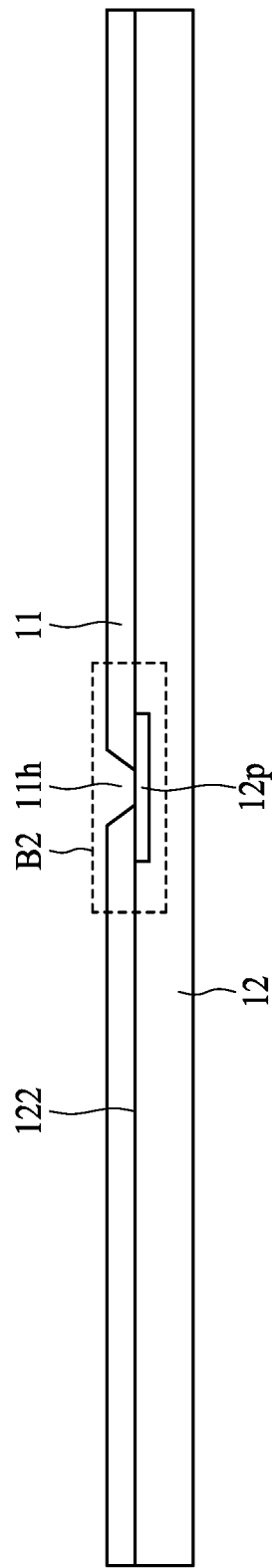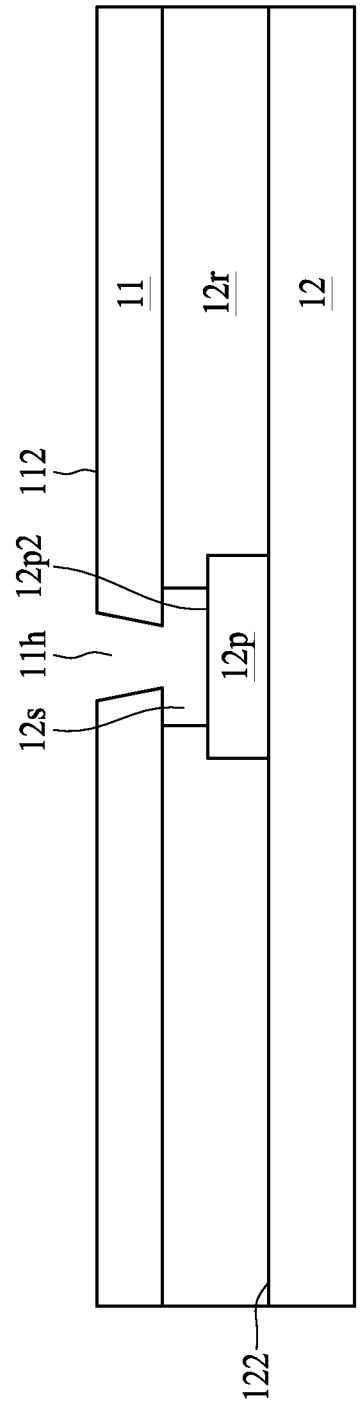

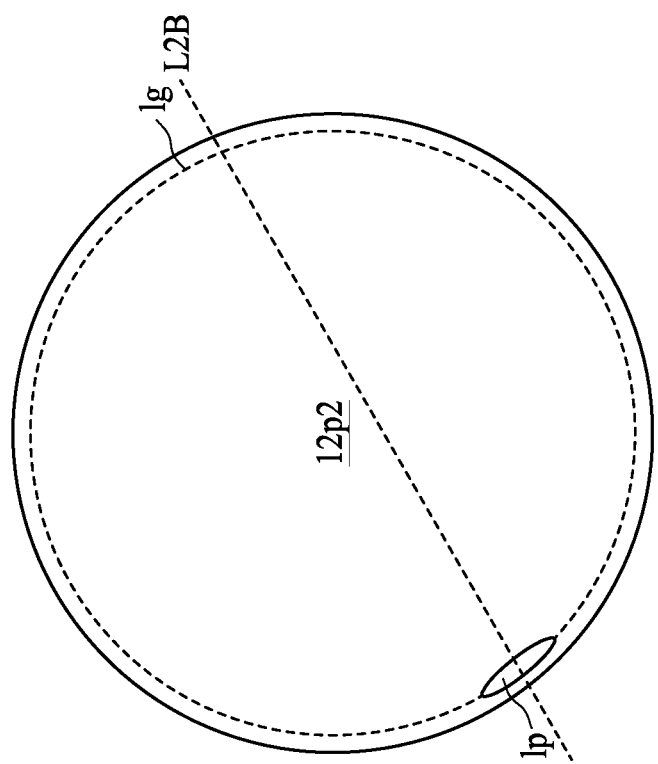
FIG. 2B"

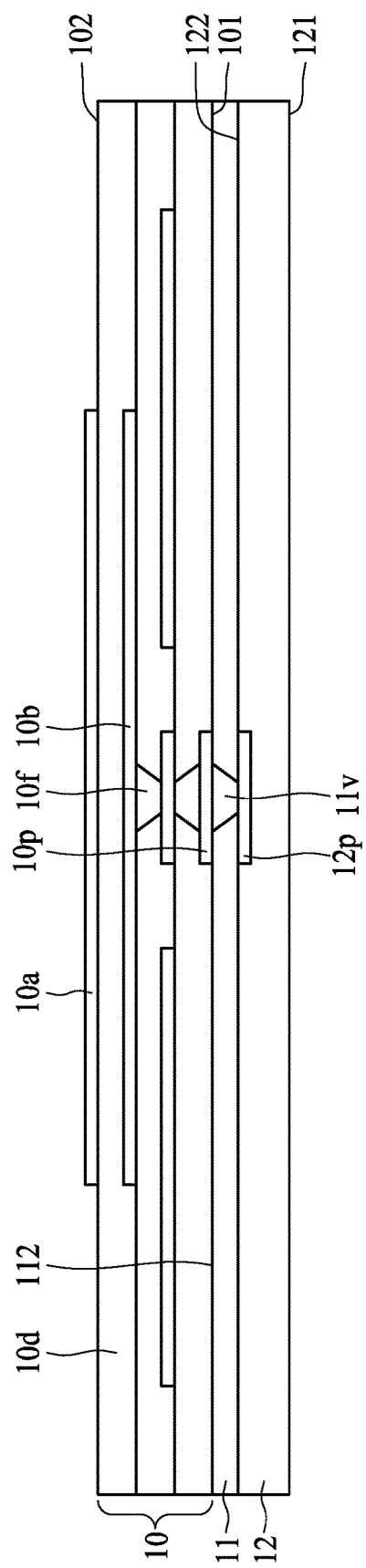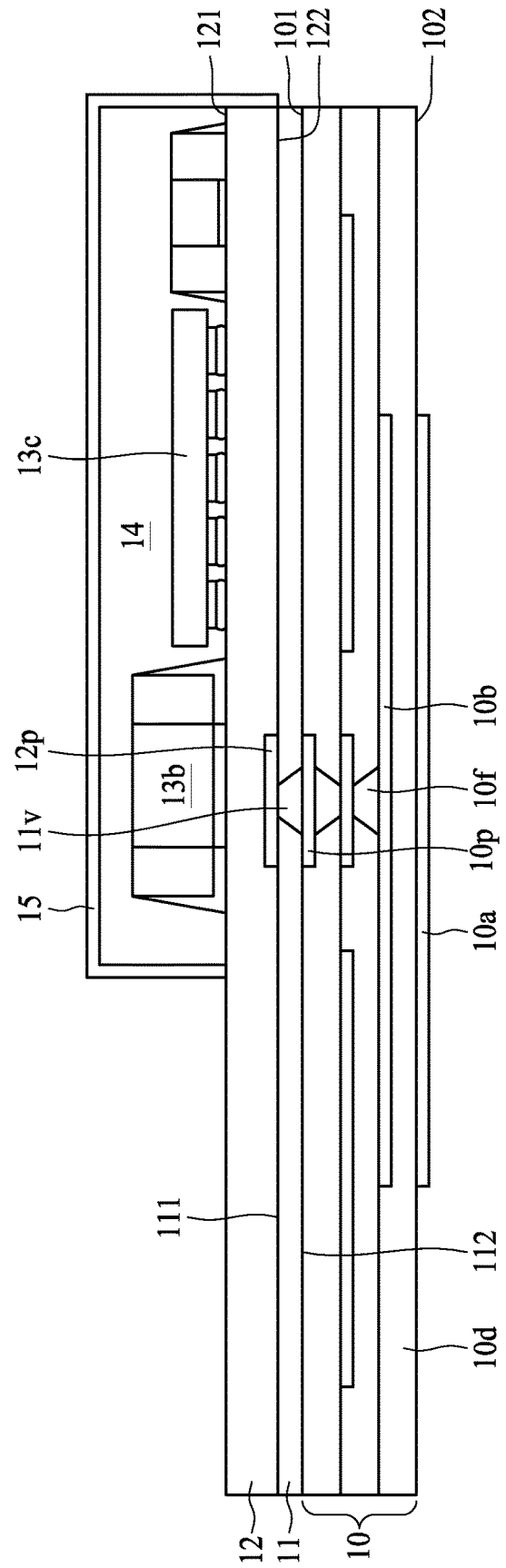

SEMICONDUCTOR DEVICE PACKAGE INCLUDING MULTIPLE SUBSTRATES WITH DIFFERENT FUNCTIONS

CROSS-REFERENCE TO RELATED APPLICATION

This application is a continuation of U.S. patent application Ser. No. 18/092,922 filed Jan. 3, 2023, now issued as U.S. Pat. No. 11,955,419, which is a continuation of U.S. patent application Ser. No. 17/151,066 filed Jan. 15, 2021, now issued as U.S. Pat. No. 11,545,426, the contents of which are incorporated herein by reference in their entirety.

BACKGROUND

1. Technical Field

The present disclosure generally relates to a semiconductor device package and a method of manufacturing the same, and to a semiconductor device package including an interconnection layer.

2. Description of the Related Art

Semiconductor device package(s) may have two or more substrates with different functions or pitches connected to each other. To enhance the performance of the semiconductor device package, the electrical connection for signal transmission between the substrates is a critical issue.

SUMMARY

In one or more embodiments, a semiconductor device package includes a first substrate and an adhesive layer. The first substrate has a first surface and a conductive pad adjacent to the first surface. The conductive pad has a first surface exposed from the first substrate. The adhesive layer is disposed on the first surface of the first substrate. The adhesive layer has a first surface facing the first substrate. The first surface of the adhesive layer is spaced apart from the first surface of the conductive pad in a first direction substantially perpendicular to the first surface of the first substrate. The conductive pad and the adhesive layer are partially overlapping in the first direction.

In one or more embodiments, a semiconductor device package includes a first substrate and a conductive via. The first substrate has a first surface and a conductive pad adjacent to the first surface. The conductive pad has a first surface exposed from the first substrate. The conductive via is electrically connected with the first surface of the conductive pad. The first surface of the conductive pad includes a trace substantially aligned with a lateral surface of the conductive pad.

In one or more embodiments, a method of manufacturing a semiconductor device package includes (a) providing a device including a first substrate and an adhesive layer disposed on the first substrate, the first substrate having a first surface and a conductive pad adjacent to the first surface, the conductive pad having a first surface exposed from the first substrate; and (b) removing a portion of the adhesive layer along a periphery of an upper surface of the conductive pad and within the upper surface of the conductive pad.

BRIEF DESCRIPTION OF THE DRAWINGS

Aspects of the present disclosure are readily understood from the following detailed description when read with the accompanying figures. It should be noted that various features may not be drawn to scale. The dimensions of the various features may be arbitrarily increased or reduced for clarity of discussion.

FIG. 1B" illustrates an enlarged view of a portion of the structure as shown in FIG. 1B', in accordance with some embodiments of the present disclosure.

FIG. 1D" illustrates an enlarged view of a portion of the structure as shown in FIG. 1D', in accordance with some embodiments of the present disclosure.

FIG. 1D''' illustrates an enlarged view of a portion of the structure as shown in FIG. 1D", in accordance with some embodiments of the present disclosure.

Common reference numerals are used throughout the drawings and the detailed description to indicate the same or similar elements. The present disclosure will be more apparent from the following detailed description taken in conjunction with the accompanying drawings.

DETAILED DESCRIPTION

Figure 1A:
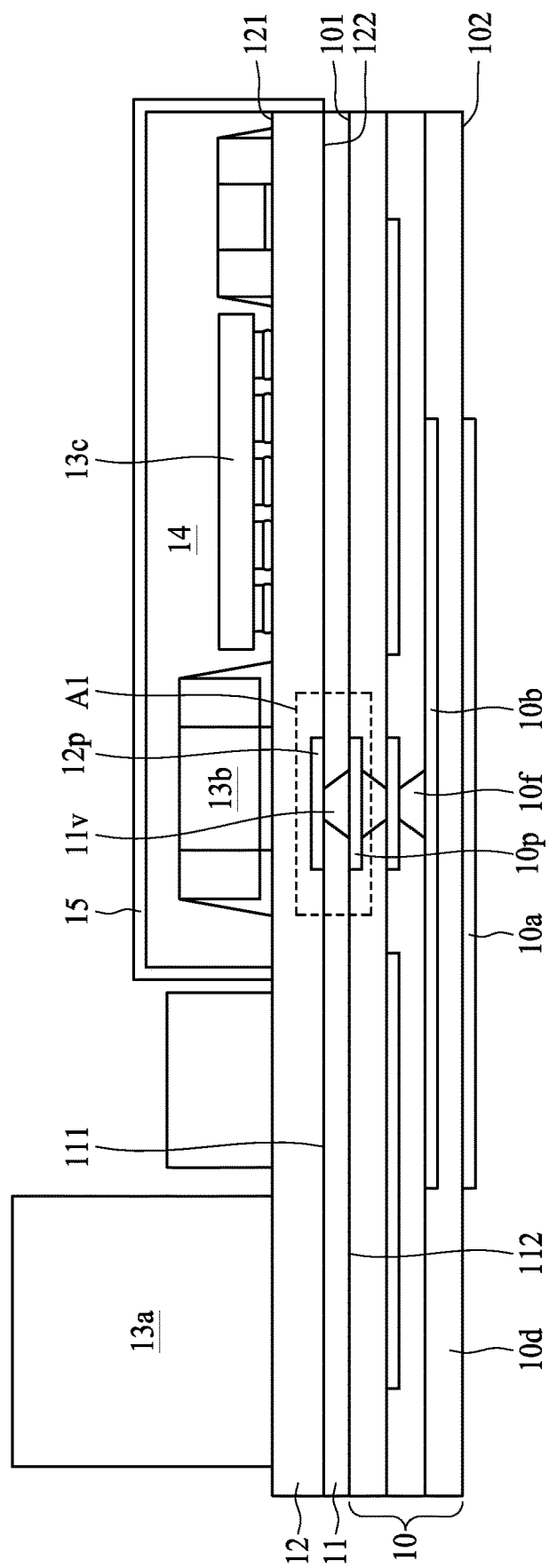
FIG. 1A illustrates a cross-sectional view of a semiconductor device package, in accordance with some embodiments of the present disclosure.

The following disclosure provides for many different embodiments, or examples, for implementing different features of the provided subject matter. Specific examples of components and arrangements are described below. These are, of course, merely examples and are not intended to be limiting. In the present disclosure, reference to the formation of a first feature over or on a second feature in the description that follows may include embodiments in which the first and second features are formed in direct contact, and may also include embodiments in which additional features may be formed between the first and second features, such that the first and second features may not be in direct contact. Besides, the present disclosure may repeat reference numerals and/or letters in the various examples. This repetition is for simplicity and clarity and does not in itself dictate a relationship between the various embodiments and/or configurations discussed.

Embodiments of the present disclosure are discussed in detail below. It should be appreciated, however, that the present disclosure provides many applicable concepts that can be embodied in a wide variety of specific contexts. The specific embodiments discussed are merely illustrative and do not limit the scope of the disclosure.

FIG. 1A illustrates a cross-sectional view of a semiconductor device package 1, in accordance with some embodiments of the present disclosure. The semiconductor device package 1 includes substrates 10, 12, an adhesive layer 11, electronic components 13a, 13b, 13c, a package body 14, and a shielding layer 15.

In some embodiments, the substrate 10 may include an antenna substrate. The substrate 10 may 10 may include one or more conductive layers 10a, 10b, 10p and one or more dielectric layers 10d. The conductive layers 10p, 10b are covered or encapsulated by the dielectric layer 10d. The conductive layer 10a is exposed from the dielectric layer 10d. For example, the conductive layer 10a is disposed on a surface 102 of the substrate 10. In some embodiments, the conductive layers 10a, 10b define or include antenna patterns. For example, the conductive layer 10b may function as a radiator. For example, the conductive layer 10a may function as a director. The conductive layer 10b may be electromagnetically coupled to the conductive layer 10a for signal transmission. One or more conductive vias 10f may be electrically connected between conductive layers to provide electrical connections therebetween. In some embodiments, the conductive via 10f may function as a feeding line for the antenna (e.g., the conductive layer 10b).

In some embodiments, the dielectric layer 10d may include pre-impregnated composite fibers (e.g., pre-preg), Borophosphosilicate Glass (BPSG), silicon oxide, silicon nitride, silicon oxynitride, Undoped Silicate Glass (USG), any combination of two or more thereof, or the like. Examples of a pre-preg may include, but are not limited to, a multi-layer structure formed by stacking or laminating a number of pre-impregnated materials/sheets. In some embodiments, the conductive layers 10a, 10b, 10p and the conductive via 10f are, or include, a conductive material such as a metal or metal alloy. Examples of the conductive material include gold (Au), silver (Ag), copper (Cu), platinum (Pt), Palladium (Pd), other metal(s) or alloy(s), or a combination of two or more thereof. The substrate 10 may include any number of the dielectric layers and conductive layers depending on different design specifications.

The substrate 12 is disposed on a surface 101 of the substrate 10. The substrate 12 is connected to the substrate 10 through the adhesive layer 11 (e.g., a tape, glue, or a die attach film (DAF)). For example, the adhesive layer 11 is disposed between a surface 122 of the substrate 12 and the surface 101 of the substrate 10 and connects the substrate 12 with the substrate 10. The substrate 12 is electrically connected to the substrate 10 through one or more conductive vias 11v. For example, the conductive via 11v penetrating the adhesive layer 11 and electrically connects the substrate 12 (e.g., a conductive pad 12p) with the substrate (e.g., the conductive layer 10p). In some embodiments, the adhesive layer 11 may be replaced by a dielectric layer or a molding compound.

The substrate 12 may be, for example, a printed circuit board, such as a paper-based copper foil laminate, a composite copper foil laminate, or a polymer-impregnated glass-fiber-based copper foil laminate. The substrate 12 may include an interconnection structure, such as a redistribution layer (RDL) or a grounding element. In some embodiments, the substrate 12 may be a single-layer substrate or multi-layer substrate. The substrate 12 may include one or more conductive pads 12p in proximity to, adjacent to, or embedded in and exposed at the surface 122 of the substrate 12.

Figure 1B:
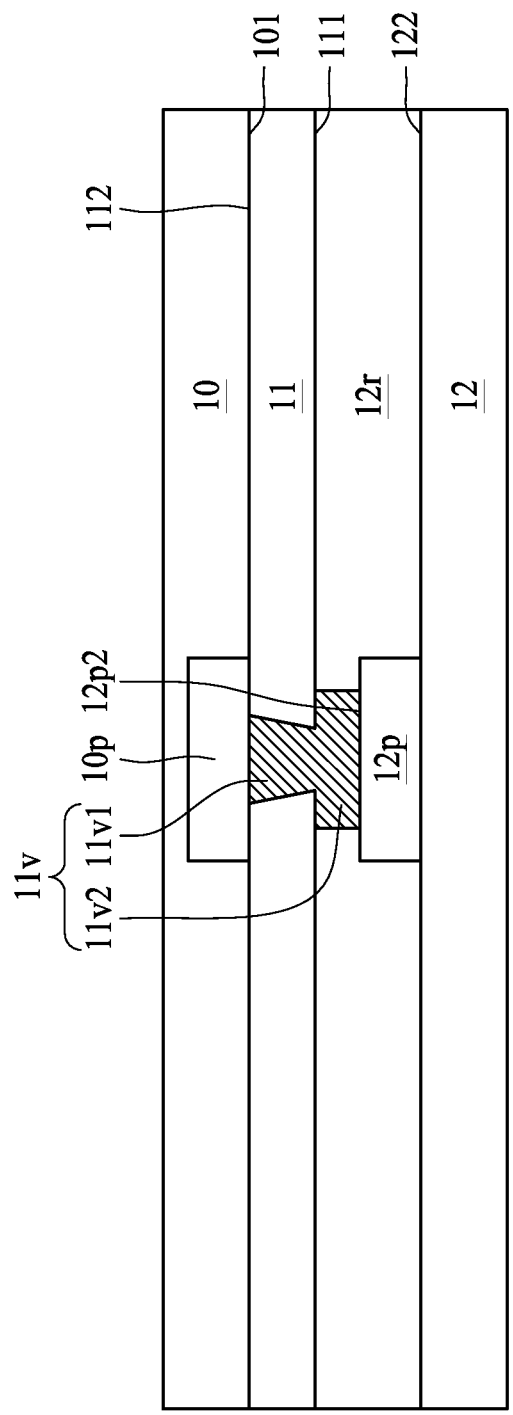
FIG. 1B illustrates an enlarged view of a portion of the semiconductor device package as shown in FIG. 1A, in accordance with some embodiments of the present disclosure.
Figure 1B:
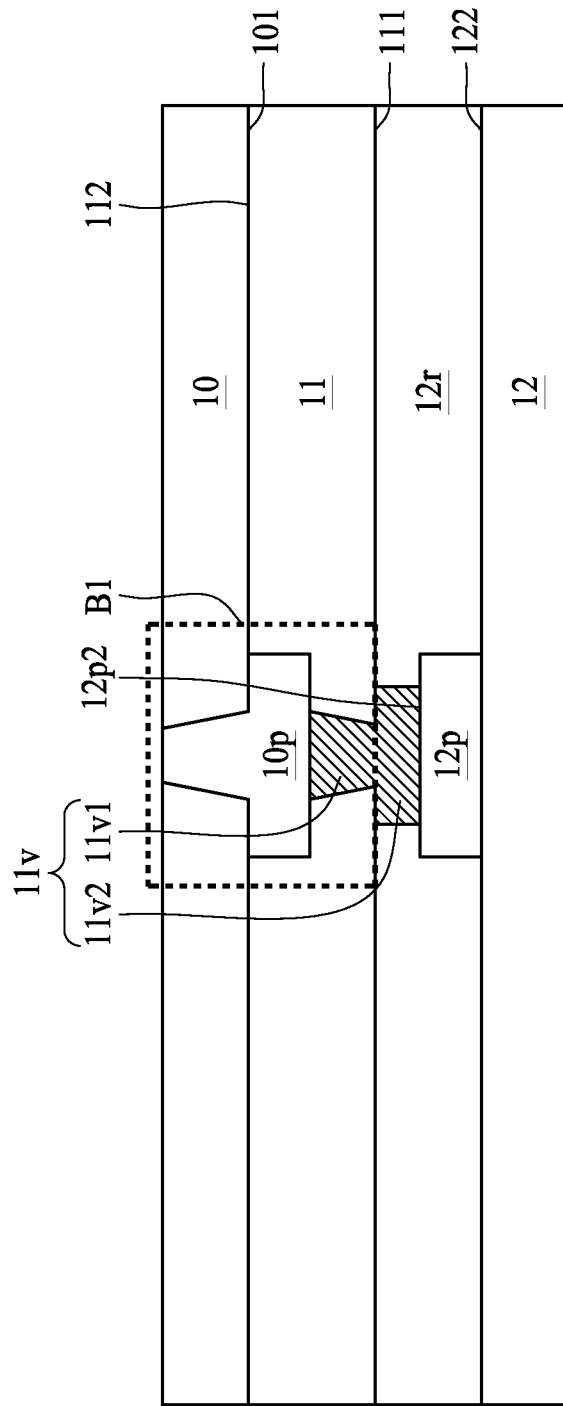

FIG. 1B illustrates an enlarged view of a portion of the semiconductor device package 1 encircled by a dotted-line box A1, in accordance with some embodiments of the present disclosure. As shown in FIG. 1B, the substrate 12 may include a solder resist 12r (or solder mask) on the surface 122 of the substrate 12 to cover a portion of the conductive pad 12p and to expose the rest portion of the conductive pad 12p for electrical connections.

As shown in FIG. 1B, the adhesive layer 11 is vertically spaced apart from the conductive pad 12p by the solder resist 12r. For example, there is a gap between the surface 111 of the adhesive layer 11 and the surface 12p2 of the conductive pad 12p. For example, the conductive pad 12 and the adhesive layer 11 are not overlapping in a direction substantially parallel to the surface 122 of the substrate 12.

The adhesive layer 11 and the solder resist 12r define openings filled with the conductive via 11v. For example, the conductive via 11v includes a portion 11v1 disposed within the opening defined by the adhesive layer 11 and a portion 11v2 (which can be referred to as a conductive element) disposed within the opening defined by the solder resist 11r. The portion 11v1 of the conductive via 11v is tapered from the substrate 10 toward the substrate 12. For example, a width of a part of the portion 11v1 of the conductive via 11v adjacent to the substrate 10 is greater than a width of a part of the portion 11v1 of the conductive via 11v adjacent to the substrate 12. In some embodiments, the maximum width of the portion 11v1 of the conductive via 11v (e.g., the part of the portion 11v1 of the conductive via 11v adjacent to the substrate 10) is less than a width of the portion 11v2 of the conductive via 11v or a width of the conductive pad 12p.

In some embodiments, the conductive via 11v is in contact with the conductive layer 10p, the adhesive layer 11, the solder resist 12r, and the surface 12p2 of the conductive pad 12p. The conductive via 11v provides electrical connections between the conductive layer 10p and the conductive pad 12p. In some embodiments, the conductive via 11v may include a conductive material. For example, the conductive via 11v may include a flowable conductive material (e.g., soldering material). For example, the conductive via 11v may include a conductive paste or glue (e.g., Ag paste, Cu paste, Al paste, or the like).

FIG. 1B' illustrates an enlarged view of a portion of the semiconductor device package 1 encircled by a dotted-line box A1, in accordance with some embodiments of the present disclosure. The structure illustrated in FIG. 1B' is similar to the structure as shown in FIG. 1B, and some of the differences therebetween are described below.

The conductive layer 10p is disposed on the surface 101 of the substrate 10. The conductive layer 10p is not embedded within the substrate 10. At least a portion of the conductive layer 10p is embedded within the adhesive layer 11. The conductive layer 10p is in contact with the adhesive layer 11 and the conductive via 11v.

FIG. 1B" illustrates an enlarged view of a portion of the structure as shown in FIG. 1B' encircled by the dotted-line box B1, in accordance with some embodiments of the present disclosure. As shown in FIG. 1B", the adhesive layer 11 has a surface 113 and a surface 114 connected between the surface 112 and the surface 111 of the adhesive layer 11. In some embodiments, the substrate 10 is disposed (or laminated) on the adhesive layer 11 to press the conductive layer 10*p* into the adhesive layer 11. Duo to the stress applied by the substrate 10 and/or the conductive layer 10*p*, the surface 113 has a curved surface, and a space may be defined among the conducive layer 10*p*, the substrate 10, and the adhesive layer 11. The surface 113 is connected between the surface 112 and the surface 114. The surface 114 is inclined. For example, the surface 114 is not perpendicular to the surface 111. The surface 114 is connected between the surface 113 and the surface 111.

Figure 1C:
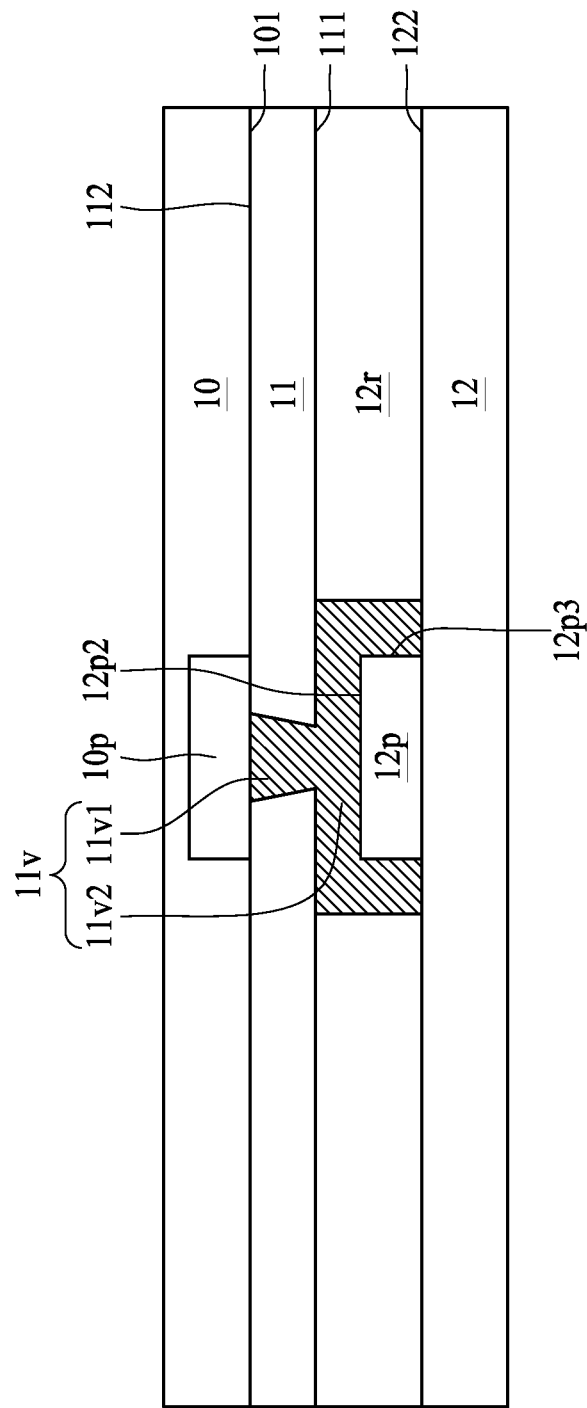
FIG. 1C illustrates an enlarged view of a portion of the semiconductor device package as shown in FIG. 1A, in accordance with some embodiments of the present disclosure.
Figure 1C:
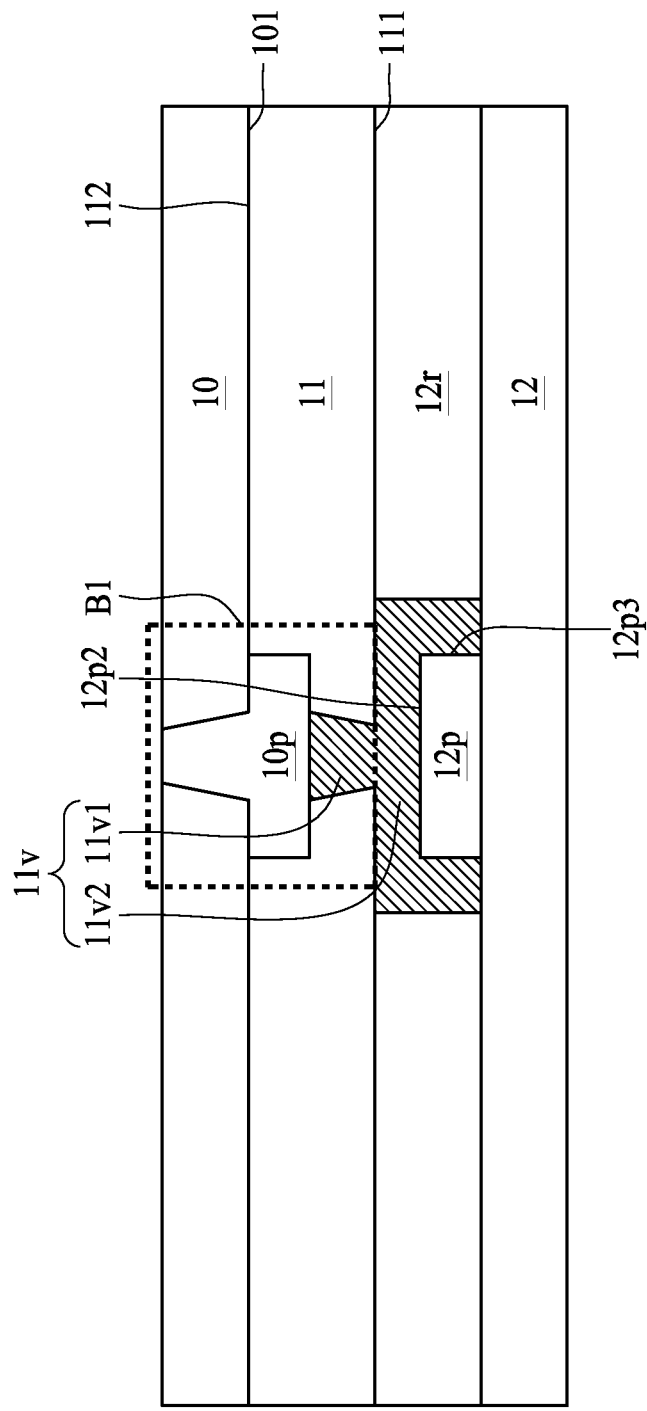

FIG. 1C illustrates an enlarged view of a portion of the semiconductor device package 1 encircled by the dotted-line box A1, in accordance with some embodiments of the present disclosure. The structure illustrated in FIG. 1C is similar to the structure illustrated in FIG. 1B, and the differences therebetween are described below.

As shown in FIG. 1C, the conductive pad 12*p* is fully exposed from the solder resist 12*r*. For example, the conductive pad 12*p* is spaced apart from the solder resist 12*r*. There is a gap between a lateral surface 12*p*3 of the conductive pad 12*p* and the solder resist 12*r*. In the case that the conductive via 11*v* includes a soldering material (e.g., Sn) (which has a relatively higher fluidity after a reflow operation), the portion 11*v*2 of the conductive via 11*v* is further disposed within the gap between a lateral surface 12*p*3 of the conductive pad 12*p* and the solder resist 12*r* as shown in FIG. 1C. The portion 11*v*2 of the conductive via 11*v* is in contact with the surface 12*p*2 and the lateral surface 12*p*3 of the conductive pad 12*p*. In the case that the conductive via 11*v* includes a conductive paste (which has a relatively lower fluidity after a reflow operation), the conductive via 11*v* may not be disposed within the gap between a lateral surface 12*p*3 of the conductive pad 12*p* and the solder resist 12*r*. Hence, the gap between a lateral surface 12*p*3 of the conductive pad 12*p* and the solder resist 12*r* may be filled with air.

FIG. 1C' illustrates an enlarged view of a portion of the semiconductor device package 1 encircled by a dotted-line box A1, in accordance with some embodiments of the present disclosure. The structure illustrated in FIG. 1C' is similar to the structure as shown in FIG. 1C, and some of the differences therebetween are described below.

The conductive layer 10*p* is disposed on the surface 101 of the substrate 10. The conductive layer 10*p* is not embedded within the substrate 10. At least a portion of the conductive layer 10*p* is embedded within the adhesive layer 11. The conductive layer 10*p* is in contact with the adhesive layer 11 and the conductive via 11*v*. In some embodiments, an enlarged view of a portion of the structure as shown in FIG. 1C' encircled by the dotted-line box B1 is the same as or similar to the structure as shown in FIG. 1B".

Figure 1D:
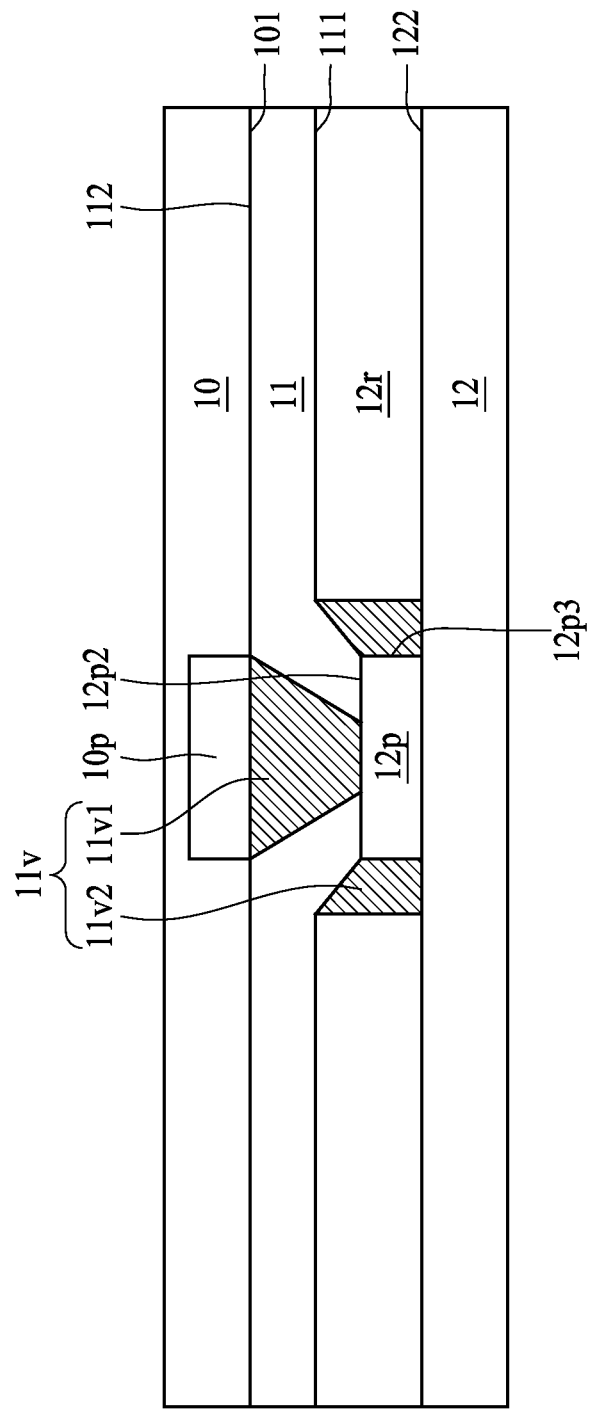
FIG. 1D illustrates an enlarged view of a portion of the semiconductor device package as shown in FIG. 1A, in accordance with some embodiments of the present disclosure.
Figure 1D:
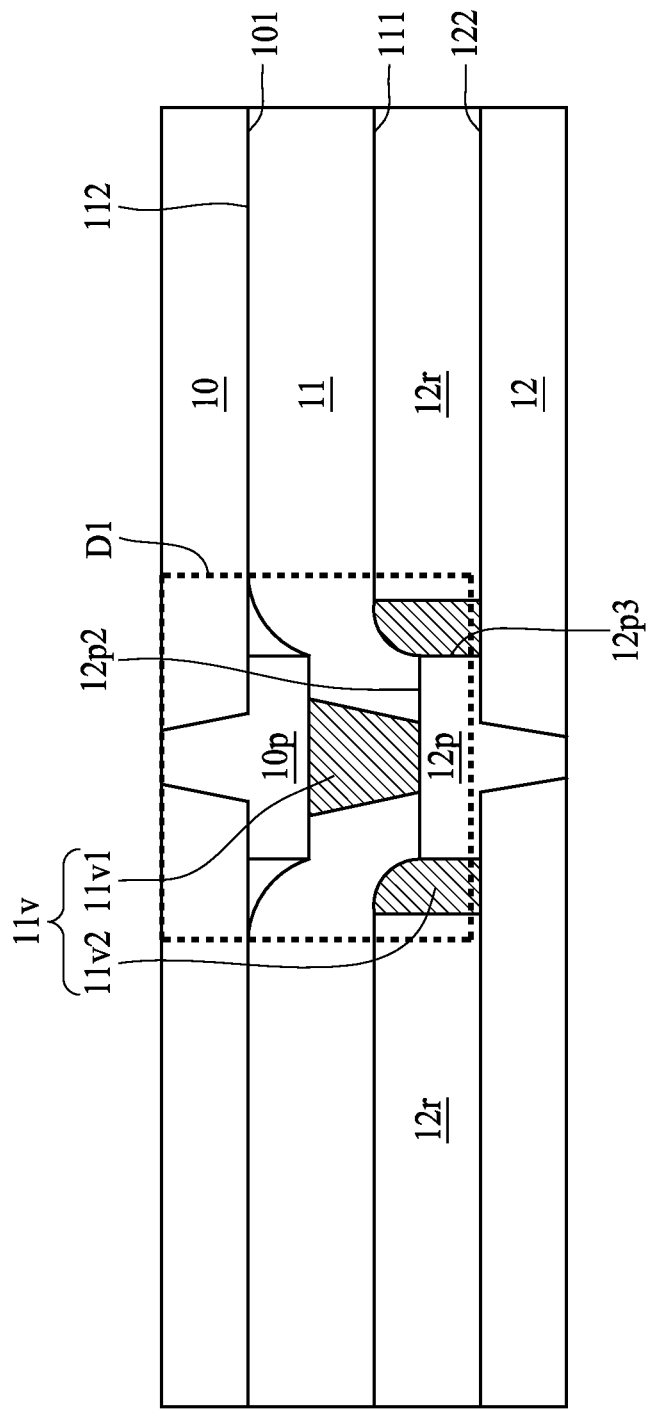
Figure 1D:
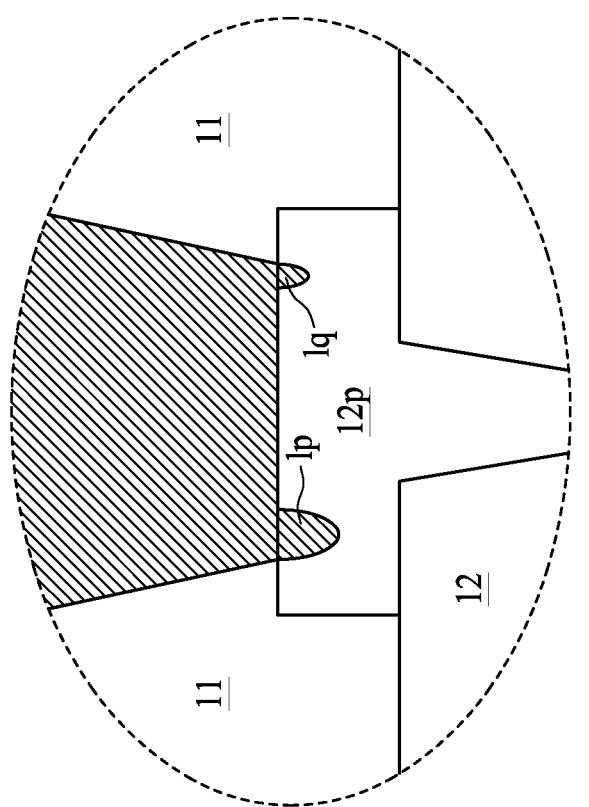

FIG. 1D illustrates an enlarged view of a portion of the semiconductor device package 1 encircled by the dotted-line box A1, in accordance with some embodiments of the present disclosure. The structure illustrated in FIG. 1D is similar to the structure illustrated in FIG. 1C, except that a portion of the adhesive layer 11 may bend downwardly by the stress applied by the substrate 10. In some embodiments, the bended portion of the adhesive layer 11 is in contact with the conductive pad 12*p*. In some embodiments, the bended portion of the adhesive layer 11 does not contact the conductive pad 12*p*, and thus there is a channel (or gap) between the adhesive layer 11 and the conductive pad 12*p*, which allows the conductive material flowing through the channel to fill the space defined by the solder resist 12*r* and the conductive pad 12*p*.

FIG. 1D' illustrates an enlarged view of a portion of the semiconductor device package 1 encircled by a dotted-line box A1, in accordance with some embodiments of the present disclosure. The structure illustrated in FIG. 1D' is similar to the structure as shown in FIG. 1D, and some of the differences therebetween are described below.

The conductive layer 10*p* is disposed on the surface 101 of the substrate 10. The conductive layer 10*p* is not fully embedded within the substrate 10. For example, the conductive layer 10*p* may fully protrude from the surface 101 of the substrate 10. For example, the conductive layer 10*p* may have a portion protruding from the surface 101 of the substrate 10 and the other portion embedded within the substrate 10. At least a portion of the conductive layer 10*p* is embedded within the adhesive layer 11. The conductive layer 10*p* is in contact with the adhesive layer 11 and the conductive via 11*v*.

FIG. 1D" illustrates an enlarged view of a portion of the structure as shown in FIG. 1D' encircled by the dotted-line box D1, in accordance with some embodiments of the present disclosure. As shown in FIG. 1D", the adhesive layer 11 has a surface 113 and a surface 114 connected between the surface 112 and the surface 111 of the adhesive layer 11. The surface 113 has a curved surface. The surface 113 is connected between the surface 112 and the surface 114. The surface 114 is inclined. The surface 114 is connected between the surface 113 and the surface 111.

In some embodiments, the conductive layer 10*p* is in contact with the conductive via 11*v* and a surface 115 of the adhesive layer 11. The conductive layer 10*p* does not contact the surface 112 of the adhesive layer 11. Therefore, the surface 115 is lower than the surface 112 due to the stress applied by the conductive layer 10*p*. For example, the surface 115 and the surface 112 have different elevations with respect to the substrate 12.

FIG. 1D''' illustrates an enlarged view of a portion of the structure as shown in FIG. 1D" encircled by the dotted-line box E1, in accordance with some embodiments of the present disclosure. As shown in FIG. 1D''', due to the manufacturing process (which will be described in detail below), the conductive pad 12*p* may include a recess (e.g., lp and lq). In some embodiments, a depth of a portion of the recess (e.g., lp) is greater than a depth of another portion of the recess (e.g., lq). In some embodiments, a portion of the conductive material (e.g., the conductive via 11*v*) is disposed within the recesses (e.g., lp and lq).

Referring to FIG. 1A, the electronic components 13*a*, 13*b*, and 13*c* are disposed on the surface 121 of the substrate 12. The electronic components 13*a*, 13*b*, and 13*c* are electrically connected to the substrate 12. The electronic component 13*a* may include a connector or socket to provide electrical connections between the semiconductor device package 1 and other circuits or circuit boards. The electrical component 13*c* may be an active component, such as an integrated circuit (IC) chip or a die. The electrical component 13*b* may be a passive electrical component, such as a capacitor, a resistor or an inductor. Each electrical component 13*a*, 13*b*, 13*c* may be electrically connected to one or more of another electrical component 13*a*, 13*b*, 13*c* and to the substrate 11 (e.g., to the RDL), and electrical connection may be attained by way of flip-chip or wire-bond techniques.

The package body 14 is disposed on a portion of the surface 121 of the substrate 12. The package body 14 covers or encapsulates the electronic components 13*b* and 13*c*. The package body 14 exposes the electronic component 13*a*. In some embodiments, the package body 14 includes an epoxy resin having fillers, a molding compound (e.g., an epoxy molding compound or other molding compound), a polyimide, a phenolic compound or material, a material with a silicone dispersed therein, or a combination thereof.

The shielding layer 15 is disposed on an external surface of the package body 14 and covers the package body 14, electronic components 13b, 13c and a portion of a lateral surface the substrate 12. The shielding layer 15 may b3 electrically connected to a grounding element of the substrate 12. In some embodiments, the shielding layer 15 is a conformal shield. In some embodiments, the shielding layer 15 is a conductive thin film, and may include, for example, Al, Cu, Cr, Sn, Au, Ag, Ni or stainless steel, or a mixture, an alloy, or other combination thereof. The shielding layer 15 may include a single conductive layer or multiple conductive layers.

Figure 2A:
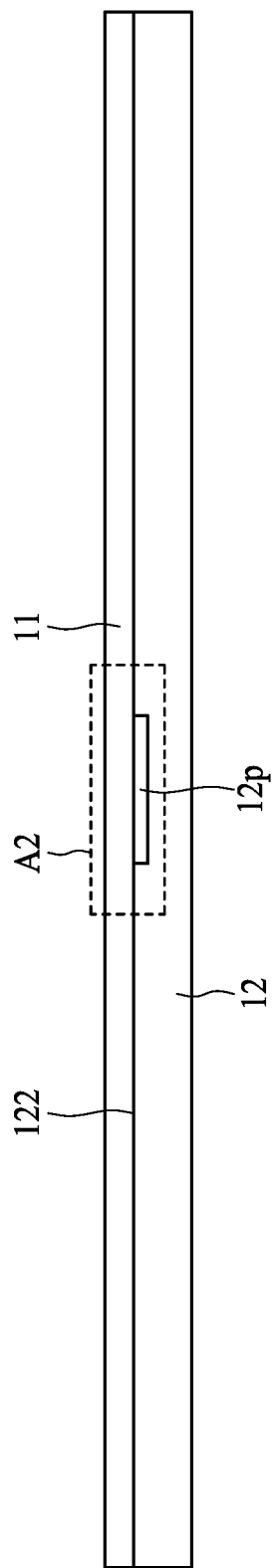
FIG. 2A, FIG. 2A', FIG. 2B, FIG. 2B', FIG. 2B", FIG. 2C, FIG. 2C'.
Figure 2A:
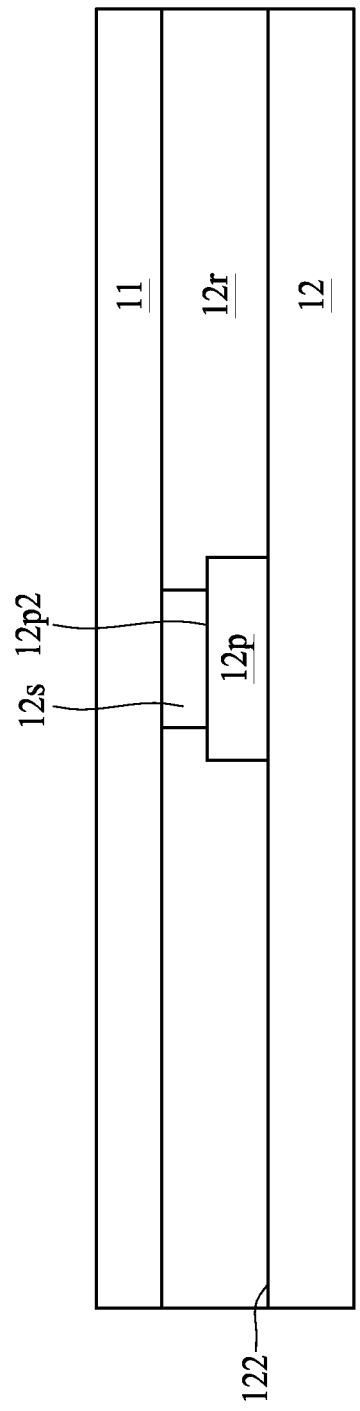
Figure 2C:
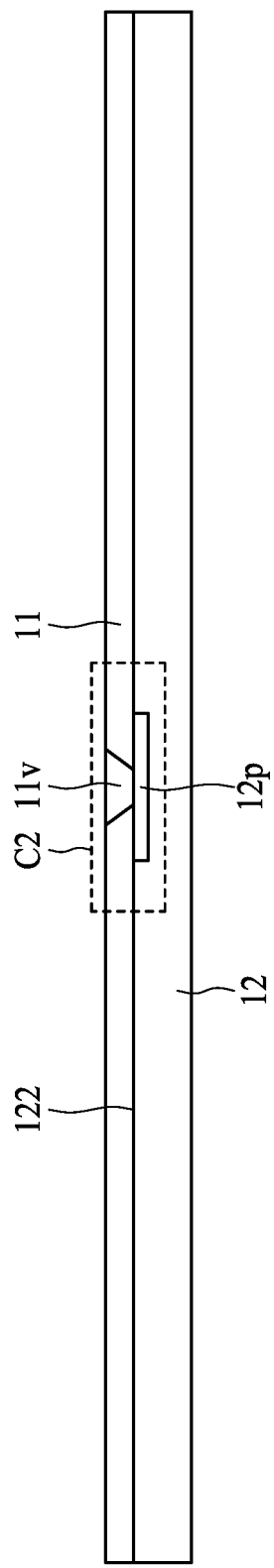
FIG. 2D, FIG. 2E, and FIG. 2F illustrate one or more stages of a method of manufacturing a semiconductor device package in accordance with some embodiments of the present disclosure.
Figure 2C:
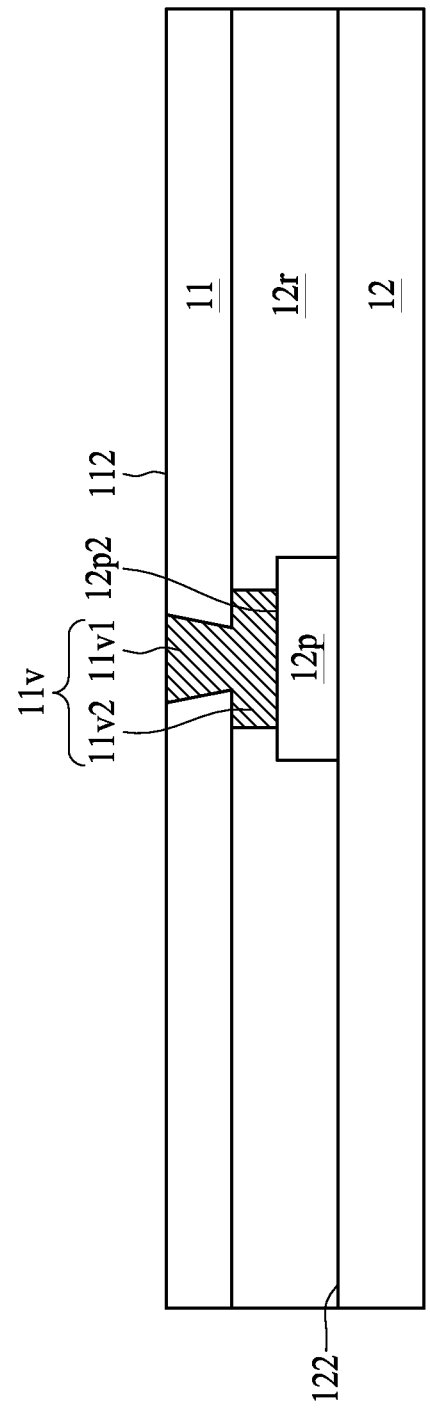
Figure 2F:
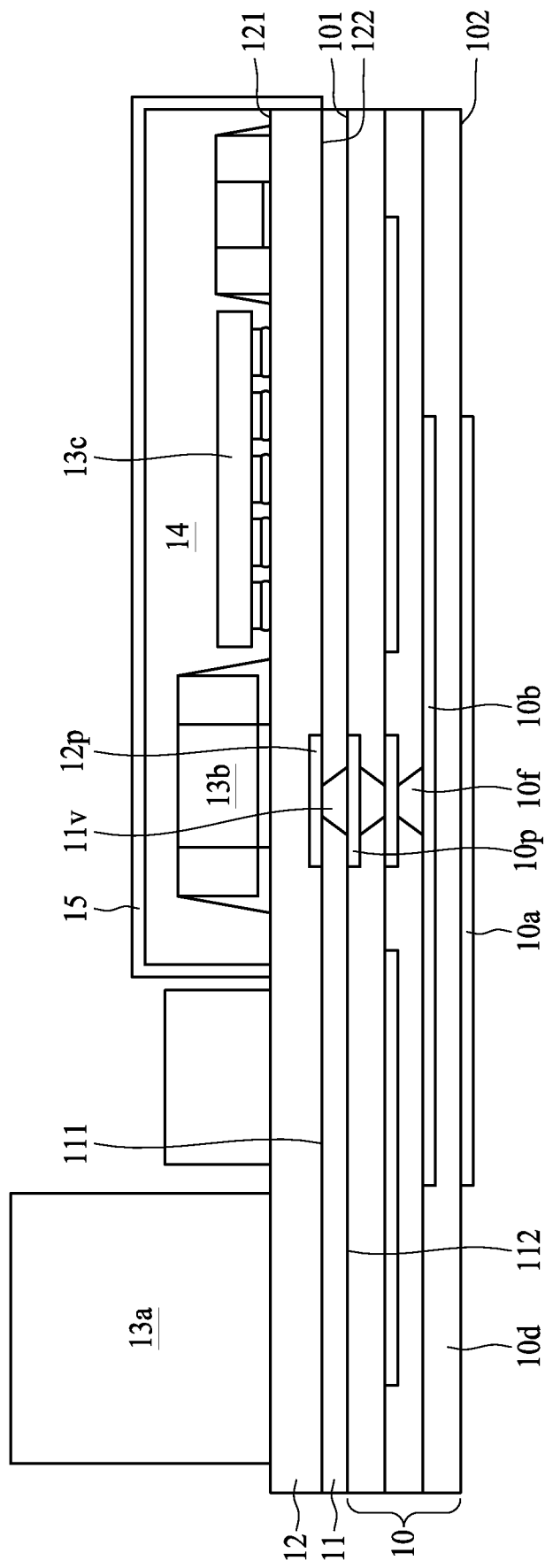

FIG. 2A, FIG. 2A', FIG. 2B, FIG. 2B', FIG. 2B'', FIG. 2C, FIG. 2C', FIG. 2D, FIG. 2E, and FIG. 2F are cross-sectional views of a semiconductor device package at various stages of fabrication, in accordance with some embodiments of the present disclosure. At least some of these figures have been simplified for a better understanding of the aspects of the present disclosure. In some embodiments, the method illustrated in FIG. 2A, FIG. 2A', FIG. 2B, FIG. 2B', FIG. 2B'', FIG. 2C, FIG. 2C', FIG. 2D, FIG. 2E, and FIG. 2F may be used to manufacture the semiconductor device package 1 as shown in FIG. 1A.

Referring to FIG. 2A, a strip of substrates including a substrate 12 is provided. The substrate 12 has one or more conductive pads 12p adjacent to a surface 122 of the substrate 12. An adhesive layer 11 is disposed on the surface 122 of the substrate 12 by, for example, lamination.

FIG. 2A' illustrates an enlarged view of a portion of the structure encircled by a dotted-line box A2 as shown in FIG. 2A, in accordance with some embodiments of the present disclosure. As shown in FIG. 2A', the substrate 12 includes a solder resist 12r covering a portion of the conductive pad 12p. For example, the solder resist 12r may cover a lateral surface and a portion of a surface 12p2 of the conductive pad 12p. The adhesive layer 11 is in contact with the solder resist 12r. Hence, the conductive pad 12p is spaced apart from the adhesive layer 11 by the solder resist 12r. For example, a space 12s is defined between the adhesive layer 11 and the conductive pad 12p. For example, the conductive pad 12 and the adhesive layer 11 are not overlapping in a direction substantially parallel to the surface 122 of the substrate 12. In some embodiments, a width of the space 12s is less than a width of the conductive pad 12p.

In some embodiments, the solder resist 12r may not cover the conductive pad 12p. For example, similar to the structure as shown in FIG. 1C, the solder resist 12r is spaced apart from the lateral surface and the surface 12p2 of the conductive pad 12p. However, the solder resist 12r is thicker than the conductive pad 12p, and thus the conductive pad 12p is still spaced apart from the adhesive layer 11.

Referring to FIG. 2B, an opening 11h is formed to fully penetrate the adhesive layer 11 to expose the space 12s.

FIG. 2B' illustrates an enlarged view of a portion of the structure encircled by a dotted-line box B2 as shown in FIG. 2B, in accordance with some embodiments of the present disclosure. As shown in FIG. 2B', the opening 11h is formed over the conductive pad 12p or the space 12s. In some embodiments, the opening 11h is tapered from a surface 112 of the adhesive layer 11 toward the solder resist 12r. For example, a width of the opening 11h adjacent to the surface 112 of the adhesive layer 11 is less than a width of the opening 11h adjacent to the solder resist 12r. In some embodiments, the width of the opening 11h adjacent to the surface 112 of the adhesive layer 11 is less than the width of the space 12s.

In some embodiments, the opening 11h can be formed by laser drill, mechanical drill, etching or any other suitable processes. In the case that the opening 11h is formed by laser drill, a laser beam is applied to the surface 112 of the adhesive layer 11 to cut through the adhesive layer 11. In some embodiments, the laser beam would also radiated on the surface 12p2 of the conductive pad 12p after the adhesive layer 11 has been cut through. For example, as shown in FIG. 2B'', which illustrates a top view of the conductive pad 12 (the cross-sectional view of the structure in FIG. 2B'' taken along the line L2B is as shown in FIG. 1D'''), a laser trace lg may be formed on the surface 12p2 of the conductive pad 12p. The laser trace lg may define a groove or trench. The laser trace lg may be circular or other shapes depending on design specifications. The laser trace lg may be a closed-loop trace. For example, the starting point of the laser trace lg and the ending point are substantially the same point (e.g., the point lp). In some embodiments, a depth of the point lp of the laser trace lg is greater than a depth of the other portion of the laser trace lg. In some embodiments, a length of the point lp of the laser trace lg is less than a length of the other portion of the laser trace lg. In some embodiments, the laser trace lg is substantially aligned with the sidewall of the opening 11h in a vertical direction.

In some embodiments, a central portion of the surface 12p2 surrounded by the laser trace lg and an outer portion of the surface 12p2 surrounding the laser trace lg are not suffered from laser beam. Hence, a roughness of the central portion of the surface 12p2 of the conductive pad 12p is less than a roughness of the laser trace lg. A roughness of the outer portion of the surface 12p2 of the conductive pad 12p is less than a roughness of the laser trace lg. The roughness of the central portion of the surface 12p2 of the conductive pad 12p is substantially the same as the roughness of the outer portion of the surface 12p2 of the conductive pad 12p. In some embodiments, a roughness of the point lp of the laser trace lg is larger than a roughness of other portions of the laser trace lg. The central portion and the outer portion of the surface 12p2 may be separated from each other by the laser trace lg.

Referring to FIG. 2C, a conductive material may be disposed within the opening 11h and to form a conductive via 11v. FIG. 2C' illustrates an enlarged view of a portion of the structure encircled by a dotted-line box C2 as shown in FIG. 2C, in accordance with some embodiments of the present disclosure. As shown in FIG. 2C', the conductive material is disposed within the space 12s to form the portion 11v2 of the conductive via 11v, and the conductive material is disposed within the opening 11v1 to form the portion 11v2 of the conductive via 11v. The conductive via 11v is in contact with the surface 12p2 of the conductive pad 12p. The conductive via 11v is in contact with the solder resist 12r and the adhesive layer 11. In some embodiments, the conductive via 11v may include a flowable conductive material (e.g., soldering material). In some embodiments, the conductive via 11v may include a conductive paste or glue (e.g., Ag paste, Cu paste, Al paste, or the like).

In some embodiments, the solder resist 12r can be omitted, and the adhesive layer 11 (or a molding compound) is in direct contact with the conductive pad 12p. After a portion of the adhesive layer 11 (or molding compound) is removed by a laser drilling to form via holes, a portion of the adhesive layer 11 (or molding compound) may remain on the surface 12p2 of the conductive pad 12. An additional operation (e.g., laser polish, etching or the like) should be carried out to remove the remaining adhesive layer (or molding compound) on the surface 12p2 of the conductive pad 12p. However, said additional operation may increase the roughness of the surface 12p2 of the conductive pad 12p, which adversely affects the electrical performance between the conductive via 11v and the conductive pad 12p. In addition, said additional operation may increase the cost and time for manufacturing the conductive via 11v.

In accordance with the embodiments as shown in FIGS. 2A, 2A', 2B, 2B', 2B", 2C, and 2C', the adhesive layer 11 is vertically spaced apart from the conductive pad 12p, and thus no residue remains on the surface 12p2 of the conductive pad 12p after a portion of the adhesive layer 11 is removed to form the opening 11h. Therefore, no additional operation (e.g., laser polish, etching or the like) is required to be carried out on the surface 12p2 of the conductive pad 12p to increase the roughness of the surface 12p2 of the conductive pad 12p. The electrical connection between the conductive pad 12p and the conductive via 11v can be improved. In addition, the cost and time for manufacturing the conductive via 11v can be reduced.

Referring to FIG. 2D, a substrate 10 is disposed on a surface 112 of the adhesive layer 11 facing away from the substrate 12. A surface 101 of the substrate 10 is connected to the adhesive layer 11. The substrate 10 may include one or more conductive layers 10a, 10b, 10p and one or more dielectric layers 10d. The conductive layer 10p is electrically connected with the conductive pad 12p through the conductive via 11v. In some embodiments, the conductive layers 10a, 10b define or include antenna patterns. For example, the conductive layer 10b may function as a radiator. For example, the conductive layer 10a may function as a director. The conductive layer 10b may be electromagnetically coupled to the conductive layer 10a for signal transmission. One or more conductive vias 10f may be electrically connected between conductive layers to provide electrical connections therebetween. In some embodiments, the conductive via 10f may function as a feeding line for the antenna (e.g., the conductive layer 10b).

Referring to FIG. 2E, electronic components 13b and 13c are disposed on the surface 121 of the substrate 12 and electrically connected to the substrate 12 by, for example, surface-mount-technology (SMT).

A package body 14 is formed on a portion of the surface 121 of the substrate 12 and covers the electronic component 13b, 13c. In some embodiments, the package body 14 may be formed by, for example, selective molding or other techniques. For example, the package 14 may 14 may be formed by the following operations: (i) forming a protection layer (e.g., water cleaning glue) on a portion of the surface 121 of the substrate 12 on which the package body will not be formed (or the electronic components 13b, 13c are not located); (ii) forming a molding compound to cover the surface 121 of the substrate 12, the protection layer, and the electronic components 13b, 13c; (iii) forming one or more openings to fully penetrate the molding compound to expose the protection layer by, for example, laser ablation; and (iv) applying water on the exposed protection layer to remove the protection layer along with the molding compound on the protection layer and to remain the package body 14 that covers the electronic components 13b, 13c as shown in FIG. 2E.

In some embodiments, singulation may be performed to separate out individual semiconductor package devices including the structure as shown in FIG. 2E. That is, the singulation is performed through the package body 14, the substrate strip including the substrates 12, the adhesive layer 11, and the substrate 10. The singulation may be performed, for example, by using a dicing saw, laser or other appropriate cutting techniques.

After singulation, a shielding layer 15 is formed on an external surface of the package body 14. The shielding layer 15 further extends along at least a portion of a lateral surface of the substrate 12. In some embodiments, the shielding layer 15 may be formed by, for example, selective sputtering or any other suitable processes.

Referring to FIG. 2F, an electronic component 13a (e.g., a connector or a socket) is disposed on a portion of the surface 121 of the substrate 12 on which the package body 14 is not disposed. The electronic component 13a may be disposed on the substrate 12 and electrically connected to the substrate 12 by, for example, SMT or any other suitable operations.

Spatially relative terms, such as "beneath," "below," "lower," "above," "upper," "left," "right" and the like, may be used herein for ease of description to describe one element or feature's relationship to another element(s) or feature(s) as illustrated in the figures. The spatially relative terms are intended to encompass different orientations of the device in use or operation, in addition to the orientation depicted in the figures. The apparatus may be otherwise oriented (rotated 90 degrees or at other orientations) and the spatially relative descriptors used herein may likewise be interpreted accordingly. It should be understood that when an element is referred to as being "connected to" or "coupled to" another element, it may be directly connected to or coupled to the other element, or intervening elements may be present.

As used herein, the terms "approximately", "substantially", "substantial" and "about" are used to describe and account for small variations. When used in conduction with an event or circumstance, the terms can refer to instances in which the event or circumstance occurs precisely as well as instances in which the event or circumstance occurs to a close approximation. As used herein with respect to a given value or range, the term "about" generally means within ±10%, ±5%, ±1%, or ±0.5% of the given value or range. Ranges can be expressed herein as from one endpoint to another endpoint or between two endpoints. All ranges disclosed herein are inclusive of the endpoints unless specified otherwise. The term "substantially coplanar" can refer to two surfaces within micrometers (μm) of lying along the same plane, such as within 10 μm, within 5 μm, within 1 μm, or within 0.5 μm of lying along the same plane. When referring to numerical values or characteristics as "substantially" the same, the term can refer to the values lying within ±10%, ±5%, ±1%, or ±0.5% of an average of the values.

The foregoing outlines features of several embodiments and detailed aspects of the present disclosure. The embodiments described in the present disclosure may be readily used as a basis for designing or modifying other processes and structures for carrying out the same or similar purposes and/or achieving the same or similar advantages of the embodiments introduced herein. Such equivalent constructions do not depart from the spirit and scope of the present disclosure, and various changes, substitutions, and alterations may be made without departing from the spirit and scope of the present disclosure.

What is claimed is:

1. An electronic package, comprising:
  a conductive pad;
  an antenna disposed over the conductive pad and electrically connected to the conductive pad;

a connecting layer disposed between the conductive pad and the antenna; and a conductive via disposed between the conductive pad and the antenna, and including a first portion and a second portion separating from the first portion, wherein the connecting layer has a first surface facing the conductive pad, a second surface and a third surface both opposite to the first surface of the connecting layer, and the second surface and the third surface of the connecting layer have different elevations with respect to the conductive pad.

2. The electronic package of claim 1, wherein the first portion of the conductive via covers a top surface and a lateral surface of the conductive pad.

3. The electronic package of claim 1, wherein the connecting layer has a fourth surface connecting to the third surface and covered by the conductive via.

4. The electronic package of claim 1, wherein the connecting layer has a fifth surface substantially coplanar with a top surface of the conductive via.

5. The electronic package of claim 1, further comprising:
a circuit structure under the conductive pad and electrically connected to the antenna through the conductive pad.

6. The electronic package of claim 1, wherein the antenna includes a conductive pattern, and a width of the conductive pattern is greater than a width of the conductive pad, and wherein the conductive pad is disposed under the conductive pattern.

7. The electronic package of claim 6, wherein the conductive via is disposed between the conductive pad and the conductive pattern, and wherein the third surface of the connecting layer has a curved surface and contacts a corner of the conductive pattern.

8. The electronic package of claim 7, wherein the second surface of the connecting layer is disposed at a higher elevation than the first surface of the connecting layer with respect to the conductive pad, and a bottom surface of the conductive via is disposed at a lower elevation than the first surface of the connecting layer with respect to the conductive pad.

9. The electronic package of claim 7, wherein a lateral surface of the conductive pattern is spaced apart from the third surface of the connecting layer.

10. The electronic package of claim 7, wherein a top surface of the conductive via contacts the conductive pattern.

11. The electronic package of claim 10, wherein the connecting layer has a fourth surface connecting to the third surface of the connecting layer and is inclined.

12. The electronic package of claim 10, wherein the connecting layer has a fifth surface contacting the conductive pattern.

13. The electronic package of claim 1, further comprising:
a circuit structure under the conductive pad,
wherein the first portion of the conductive via and the second portion of the conductive via are separated by the connecting layer.

14. The electronic package of claim 13, wherein the first portion and the second portion of the conductive via are disposed on opposite sides of the conductive pad.

15. The electronic package of claim 14, wherein a top surface of the conductive pad is covered by the first portion of the conductive via and the connecting layer.

16. The electronic package of claim 15, wherein the second portion of the conductive via is spaced apart from the top surface of the conductive pad.

17. The electronic package of claim 16, wherein a corner of the connecting layer is disposed within a recess defined by the first portion.

18. The electronic package of claim 16, further comprising:
a solder resist laterally spaced apart from the conductive pad, wherein the first portion of the conductive via is disposed between the solder resist and the conductive pad.

19. The electronic package of claim 18, wherein the first surface of the connecting layer contacts the solder resist.

* * * * *